United States Patent
Manku et al.

(10) Patent No.: US 8,472,552 B2
(45) Date of Patent: Jun. 25, 2013

(54) DIGITAL LINEAR TRANSMITTER ARCHITECTURE

(75) Inventors: Tajinder Manku, Waterloo (CA); Abdellatif Bellaouar, Richardson, TX (US)

(73) Assignee: Icera, Inc., Calgary (CA)

( * ) Notice: Subject to any disclaimer, the term of this patent is extended or adjusted under 35 U.S.C. 154(b) by 1038 days.

(21) Appl. No.: 12/520,486

(22) PCT Filed: Dec. 14, 2007

(86) PCT No.: PCT/CA2007/002252
§ 371 (c)(1),
(2), (4) Date: Jun. 19, 2009

(87) PCT Pub. No.: WO2008/077235
PCT Pub. Date: Jul. 3, 2008

(65) Prior Publication Data
US 2010/0027711 A1    Feb. 4, 2010

Related U.S. Application Data

(60) Provisional application No. 60/871,489, filed on Dec. 22, 2006.

(51) Int. Cl.
*H04L 27/00* (2006.01)

(52) U.S. Cl.
USPC ........... 375/295; 375/376; 375/373; 375/136; 375/146; 455/102; 341/144; 341/152; 341/200; 327/53; 327/66; 327/147; 327/156

(58) Field of Classification Search
USPC .................. 341/144, 152, 200; 375/295, 376, 375/373, 136, 146; 327/53, 66, 147, 156; 455/102
See application file for complete search history.

(56) References Cited

U.S. PATENT DOCUMENTS

| 4,998,108 | A | | 3/1991 | Ginthner et al. |
| 5,600,320 | A | * | 2/1997 | Wilson et al. ............... 341/144 |

(Continued)

FOREIGN PATENT DOCUMENTS

| EP | 1 134 899 | 9/2001 |
| EP | 1 505 736 | 2/2005 |

(Continued)

OTHER PUBLICATIONS

Heidar-Bargi et al digital architecture for direct digital-to-RF converters,IEEE CCECE/CCGEI, May 2006, pp. 1576-1581.*

(Continued)

*Primary Examiner* — Daniel Washburn
*Assistant Examiner* — Rahel Guarino

(57) ABSTRACT

A digital linear transmitter for digital to analog conversion of a radio frequency signal. The transmitter includes a delta sigma (ΔΣ) digital to analog converter (DAC) and a weighted signal digital to analog converter in the transmit path of a wireless device to reduce reliance on relatively large analog components. The ΔΣ DAC converts the lowest significant bits of the oversampled signal while the weighted signal digital to analog converter converts the highest significant bits of the oversampled signal. The transmitter core includes components for providing an oversampled modulated digital signal which is then subjected to first order filtering of the oversampled signal prior to generating a corresponding analog signal. The apparatus and method reduces analog components and increases digital components in transmitter core architecture of wireless RF devices.

9 Claims, 6 Drawing Sheets

U.S. PATENT DOCUMENTS

| | | |
|---|---|---|
| 5,764,172 A | 6/1998 | Rodal |
| 2005/0007267 A1* | 1/2005 | Zogakis et al. ............... 341/143 |
| 2005/0287967 A1 | 12/2005 | Hung et al. |
| 2006/0119499 A1* | 6/2006 | Brady et al. .................. 341/155 |
| 2006/0178120 A1 | 8/2006 | Puma |
| 2006/0203922 A1* | 9/2006 | Rezeq ........................... 375/247 |

FOREIGN PATENT DOCUMENTS

| | | |
|---|---|---|
| JP | 2001-332973 | 11/2001 |
| JP | 2006-222972 | 8/2006 |
| WO | 03/096542 | 11/2003 |
| WO | 2005/120001 A2 | 12/2005 |

OTHER PUBLICATIONS

Japanese Patent Office, office action related to JP application No. 2009-541703, mailed Jun. 14, 2011, 4 pages.

European Patent Office, Extended European Search Report for EP 07 85 5534.9 (PCT/CA2007002252), dated Dec. 1, 2011, 7 pages, Munich, Germany.

PCT/CA2007/002252, International Preliminary Report on Patentability, 6 pages, Jul. 2, 2009.

* cited by examiner

DIGITAL LINEAR TRANSMITTER ARCHITECTURE

CROSS REFERENCE TO RELATED APPLICATIONS

This application claims the benefit of priority of U.S. Provisional Patent Application No. 60/871,489 filed Dec. 22, 2006, which is incorporated herein by reference.

FIELD OF THE INVENTION

The present invention relates generally to wireless communications including digital to analog conversion of a radio frequency signal. More particularly, the present invention relates to delta sigma digital to analog converters in the transmit path of a wireless device.

BACKGROUND OF THE INVENTION

Wireless devices have been in use for many years for enabling mobile communication of voice and data. Such devices can include mobile phones and wireless enabled personal digital assistants (PDA's) for example. Wireless devices are preferably low power to maximize battery life, and small to be packed into progressively shrinking form factor devices. FIG. 1 is a generic block diagram of the core components of such wireless devices. The wireless core 10 includes a base band processor 12 for controlling application specific functions of the wireless device and for providing and receiving voice or data signals to a radio frequency (RF) transceiver chip 14. The RF transceiver chip 14 is responsible for frequency up-conversion of transmission signals, and frequency down-conversion of received signals. RF transceiver chip 14 includes a receiver core 16 connected to an antenna 18 for receiving transmitted signals from a base station or another mobile device, and a transmitter core 20 for transmitting signals through the antenna 18. Those of skill in the art should understand that FIG. 1 is a simplified block diagram, and can include other functional blocks that may be necessary to enable proper operation or functionality.

Generally, the transmitter core 20 is responsible for up-converting electromagnetic signals from base band to higher frequencies for transmission, while receiver core 16 is responsible for down-converting those high frequencies back to their original frequency band when they reach the receiver, processes known as up-conversion and down-conversion (or modulation and demodulation) respectively. The original (or base band) signal, may be, for example, data, voice or video. These base band signals may be produced by transducers such as microphones or video cameras, be computer generated, or transferred from an electronic storage device. In general, the high frequencies provide longer range and higher capacity channels than base band signals, and because high frequency RF signals can propagate through the air, they are preferably used for wireless transmissions as well as hard-wired or fiber channels. All of these signals are generally referred to as RF signals, which are electromagnetic signals; that is, waveforms with electrical and magnetic properties within the electromagnetic spectrum normally associated with radio wave propagation.

FIG. 2 is a schematic representation of a known architecture of the transmitter core 20 as shown in FIG. 1. Such transmitter architecture 50 as seen in FIG. 2 includes a data input for handling a digital signal and an output for producing an analog signal for transmission at an antenna. Accordingly, the transmitter architecture 50 will include both digital and analog circuitry.

Within FIG. 2, data to be transmitted will be digitally modulated with modulator 52 using an in-phase/quadrature (IQ) modulation scheme suitable for the given application. The function of modulator 52 is to provide quadrature I and Q phases of the signal data. This IQ modulation may be Frequency Shift Keyed (FSK), minimum shift keyed (MSK), Gaussian Minimum Shift Keyed (GMSK), Phase Shift Keyed (PSK), Binary Phase Shift Keyed (BPSK), Quadrature Phase Shift Keyed (QPSK), Offset Quadrature Phase Shift Keyed (O-QPSK), or any other suitable digital modulation scheme. For example, a widely used modulation scheme is GMSK within the wireless time division multiple access (TDMA) platform for the Global System for Mobile communications (GSM) standard, whereas the modulation scheme may be QPSK or O-QPSK within the wireless code-division multiple access (CDMA) platform for Interim Standard 95 (IS-95). Once digitally modulated with modulator 52, the sampling rate of the signal is then increased via upsampler 54 to provide a higher bit rate signal. Typically, the modulated data signal is at about 400 KHz and the upsampling increases the data to a higher frequency (e.g., 26 MHz) for further processing. Once upsampled, the data signal is then passed through a reconstruction filter 56 so as to bring the data to the correct values relative to the lower frequency data values.

The reconstructed data signal is then passed to a Digital to Analog Converter (DAC) 58 which represents the point at which the digital architecture passes to an analog architecture. Typically, each element 52 through 58 is driven by a clock signal, clk. It should be understood that the lower frequency digital modulator 52 is clocked via a clock divider 60 where the clock is divided by N, where N is an integer value selected for the given application and desired operating frequencies. The data signal after the DAC 58 is therefore an analog signal. Such analog signal requires filtering due to noise attributed to the DAC 58, which is introduced by the quantization of the signal taking place in the digital-to-analog conversion process in DAC 58. Such filtering is accomplished via $2^{nd}$ order to $4^{th}$ order filter 62, and typically consists of a combination of transconductance cells, transconductance-capacitor filters, Metal-Oxide-Silicon-Capacitor (MOS-capacitor) filters, resistor-capacitor (RC) filters, and op-amp circuits arranged in well known configurations. Such a filter 62 serves to reduce the quantization noise from the DAC 58.

The filtered signal is then passed in turn to a voltage to current (V2I) converter 64, a mixer 66, and amplifier/output driver 68 before it is driven onto the antenna. This process beyond the $2^{nd}$ to $4^{th}$ order filtering 62 is known as linear direct conversion, or linear upconversion. Essentially, a clock (not shown) is applied at the mixer where the clock frequency is equal to the signal frequency being applied out of the antenna. For example, if the desired antenna signal is to be at 900 MHz, then the clock applied at the mixer will be 900 MHz. Performing such linear upconversion is typically easier using current than using voltage, hence the use of the V2I converter 64. It should be noted that some processing methods involving linear upconversion may involve merely using an inputted analog signal. In such instance, the digital components (i.e., components including DAC and prior), are not required, Regardless, the V2I converter 64 will produce signal distortion because it is a purely analog component. That is to say, when the V2I converter 64 converts voltage to current there will not be precise linear to linear conversion. Rather, there will typically be some level of distortion in such conversion.

At the present time, the aforementioned filtering and V2I conversion components function in the analog domain. This means that they are configured and operated for analog signal processing and can suffer from typical analog circuit problems. For example, the circuit transfer functions can vary between identical circuits on the same chip, and can vary from chip to chip. The varying coefficients of the transfer function will adversely affect its characteristics, such as its phase and pass band shape, for example. Moreover, from a manufacturing cost perspective, analog circuits do not scale well with each process generation. Digital circuits on the other hand are easily scalable. Therefore, mixed circuits will tend to be dominated in size by the analog circuits, unnecessarily increasing the area of the device.

It is, therefore, desirable to provide a wireless transmitter core architecture that will reduce circuit area consumption while maximizing the amount of digital domain circuits to improve signal quality. The use of more digital domain circuits allows for improved scalability while minimizing performance variation due to process variation.

SUMMARY OF THE INVENTION

It is an object of the present invention to obviate or mitigate at least one disadvantage of previous transmitter core architecture reliant on analog circuit elements.

In a first aspect, the present invention provides wireless device transmitter for transmitting a radio frequency (RF) output signal. The wireless device transmitter includes an input stage, an oversampling stage, and a digital to analog converter (DAC). The input stage receives a modulated digital signal. The oversampling stage increases a frequency of said modulated digital signal to form an oversampled signal of i bits in size, where i is an integer value greater than 1. The digital to analog converter (DAC) circuit receives said i bits of the oversampled signal, and executes a first order delta sigma ($\Delta\Sigma$) conversion of j least significant bits of the oversampled signal and executing weighted transistor conversion of i-j most significant bits of the oversampled signal for generating a corresponding analog signal, where j is an integer value greater than 1 and less than i. In an embodiment of the first aspect, said oversampling stage includes a clock converter circuit that produces a high frequency clock for driving at least an upsampling circuit, a reconstruction filter circuit, and the DAC circuit. In the present embodiment, the high frequency clock includes a phase locked loop and a ring oscillator operatively arranged to transform an input clock signal having a low frequency into the high frequency clock. Furthermore, the oversampling stage includes an analog component formed by a voltage controlled oscillator (VCO), and the clock converter circuit is formed by at least two clock dividers and a rate conversion circuit. The VCO and the clock converter circuit are operatively arranged such that an output of said VCO forms said high frequency clock.

According to another embodiment of the first aspect, the input stage and the oversampling stage operate in a digital domain. In a further embodiment of the first aspect, the DAC circuit includes a $\Delta\Sigma$ digital to analog converter and a weighted transistor digital to analog converter. The $\Delta\Sigma$ digital to analog converter generates a first current corresponding to the j least significant bits of the oversampled signal. The weighted transistor digital to analog converter receives the i-j most significant bits and generates i-j corresponding currents. In the present embodiment, the DAC circuit includes a current summing element and a current mirror circuit. The current summing element generates a final current corresponding to the aggregate sum of the first current and the i-j corresponding currents. The current mirror circuit has a first order filtering circuit for receiving the final current to provide a filtered final current signal. Furthermore, the DAC circuit includes a mixer circuit for upconverting the filtered final current signal.

In a second aspect, the present invention provides a method for processing a radio frequency (RF) output signal in a wireless device transmitter. The method includes receiving a modulated digital signal; oversampling the modulated digital signal to obtain an oversampled signal i bits in size, where i is an integer value greater than 1; converting j bits of the oversampled signal into a first analog signal using a first digital to analog conversion scheme, where j is an integer value greater than 1 and less than i; converting i-j bits of the oversampled signal into at least one second analog signal using a second digital to analog conversion scheme; combining the first analog signal and the at least one second analog signal to provide a final analog signal; and executing first order filtering of said final analog signal.

According to embodiments of the second aspect, the first digital to analog converting scheme includes delta sigma ($\Delta\Sigma$) digital to analog conversion of said j bits to provide the first analog signal, and the second digital to analog converting scheme includes weighted digital to analog conversion of said i-j bits to provide i-j second analog signals. In a further embodiment of the second aspect, the first analog signal and the at least one second analog signal are currents, and the step of combining includes summing the currents to obtain a final current, the final current corresponding to the final analog signal.

In yet another embodiment, the oversampling is accomplished by generating an increase to said clock frequency using a phase locked loop and ring oscillator operatively arranged to transform an input clock signal having a low frequency into a high frequency clock. Alternately, the oversampling is accomplished by generating an increase to said clock frequency using an analog component formed by a voltage controlled oscillator (VCO) and a clock converter circuit formed by at least two clock dividers and a rate conversion circuit where said VCO and said clock converter circuit are operatively arranged such that an output of said VCO forms a high frequency clock.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached Figures, wherein.

DETAILED DESCRIPTION

Generally, the present invention provides an apparatus and method for reducing analog components and increasing digital components in the transmitter core of a wireless RF device.

Figure 1:
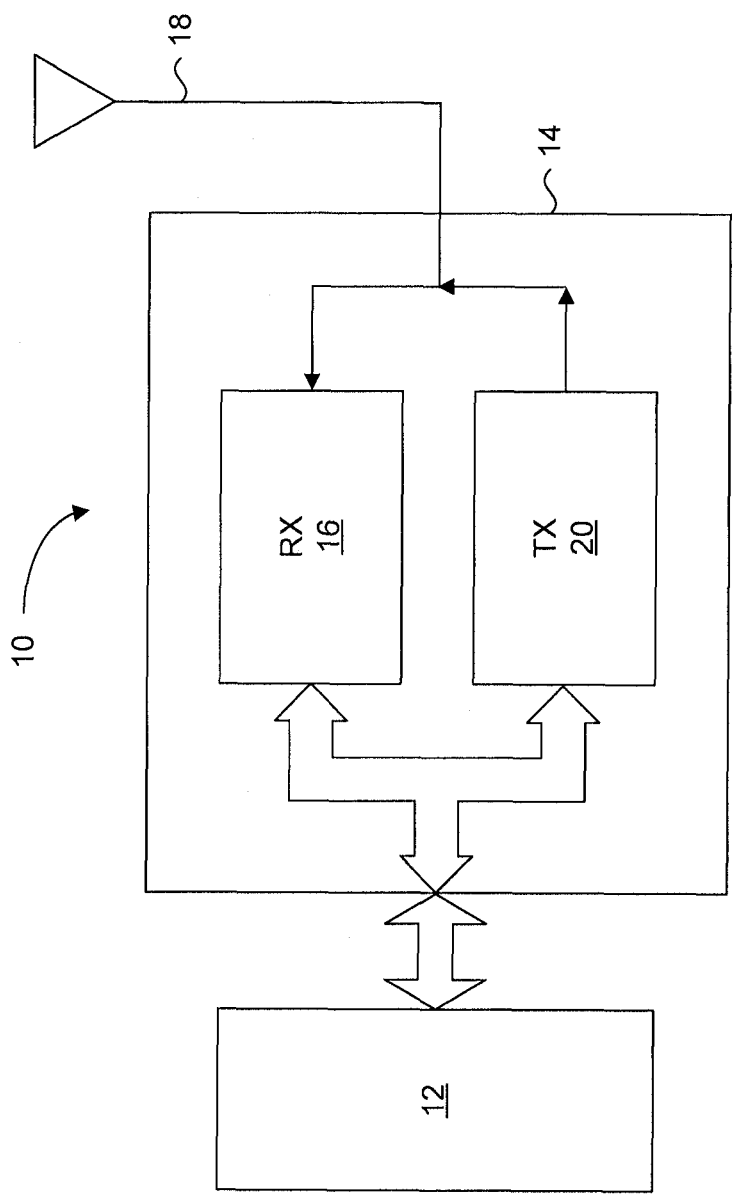
FIG. 1 is a generic block diagram of known core components of a wireless device.
Figure 2:
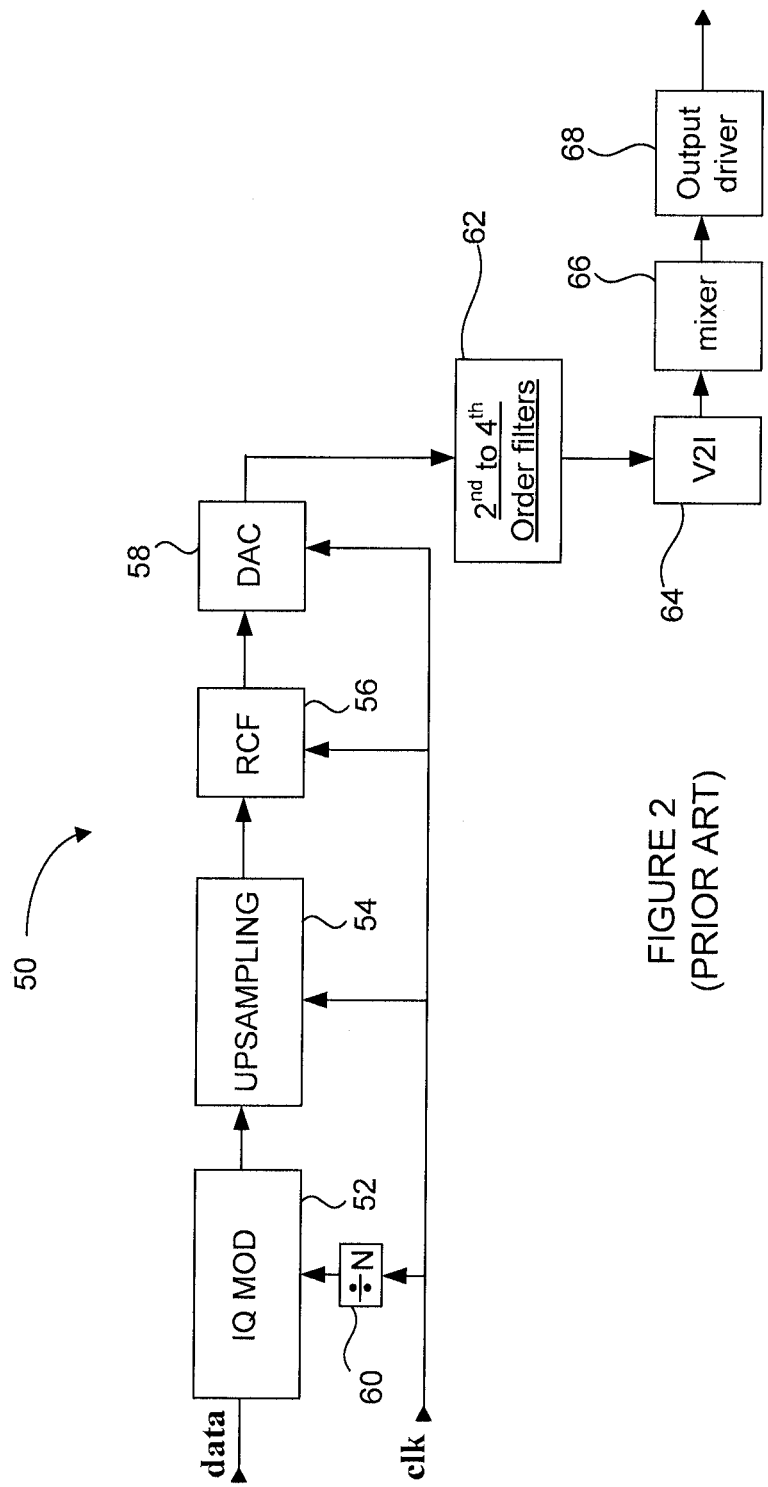
FIG. 2 is a schematic representation of a known architecture of the transmitter core shown in FIG. 1.

More particularly, the present invention seeks to eliminate the V2I converter and $2^{nd}$ to $4^{th}$ order analog filters used in the prior art transmitter core of FIG. 2. The V2I converter adds distortion to the transmit signal and occupies a relatively large circuit area on the chip. The $2^{nd}$ to $4^{th}$ order analog filter is also a large circuit on the chip. According to the embodiments of the present invention, the V2I converter and the $2^{nd}$ to $4^{th}$ order filters can be removed from the transmit core by reducing the amount of quantization noise in the DAC. This allows the present invention to provide improvements in chip size reduction thereby reducing related manufacturing costs.

For purposes of the present invention, the terms "oversampling" and "upsampling" will be used. Oversampling is defined as sampling a signal many times over and above that actually required by the sampling frequency. Upsampling is defined in terms of digital processing where a data stream is expanded via interpolation from, for example, 400 KHz to 26 MHz.

In order to reduce the quantization noise in the DAC, the present invention provides for oversampling of the DAC. Such oversampling is utilized by way of a delta sigma ($\Delta\Sigma$) DAC and allows the delta sigma DAC to work more linearly with the extracted data. The $\Delta\Sigma$ DAC uses the known technique of $\Delta\Sigma$ modulation which is not further described in detail herein. Such reduction in the quantization noise therefore further provides for a reduction in the filtering requirements such that only a $1^{st}$ order filtering stage may be necessary. The present invention also integrates the $1^{st}$ order filtering and mixer component with the $\Delta\Sigma$ DAC. That is to say, the $\Delta\Sigma$ DAC receives an oversampled signal and executes first order filtering of the oversampled signal prior to generating a corresponding analog signal.

Figure 3:
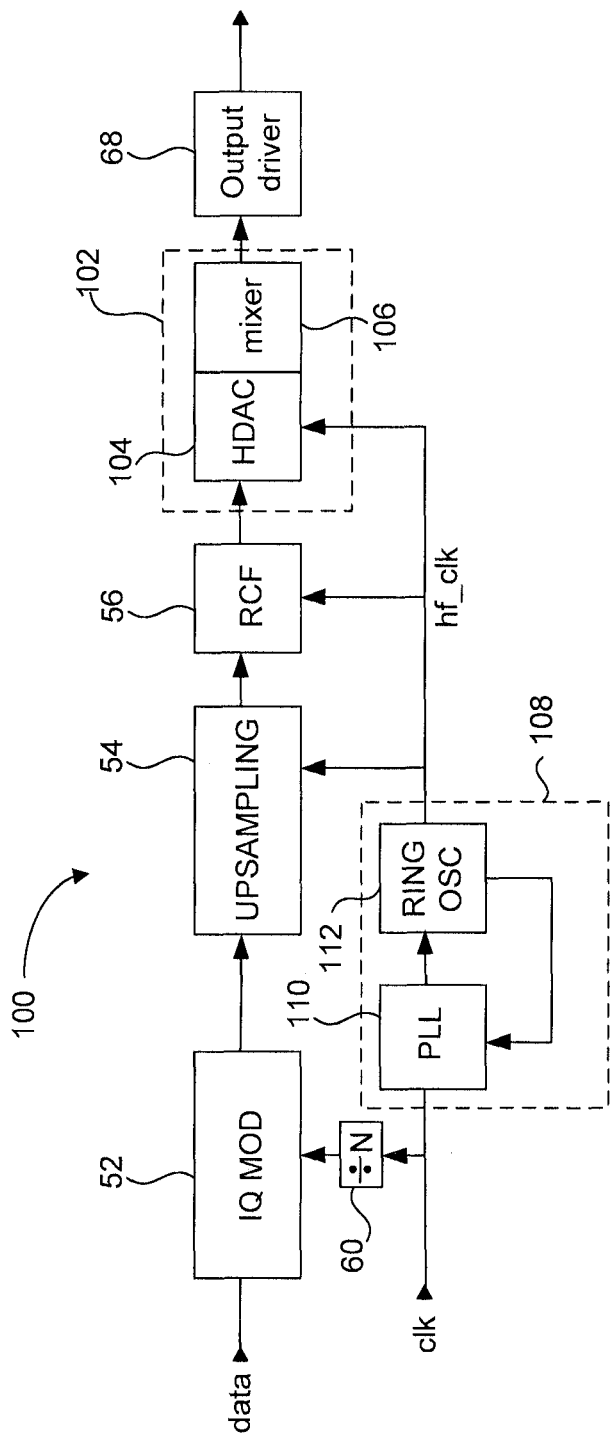
FIG. 3 is a schematic representation of an embodiment of a transmitter core in accordance with the present invention.

With specific reference to the transmit core 100 of FIG. 3, like numbering will be used for components unchanged from prior art FIG. 2. Specifically, data to be transmitted will, as before, be digitally modulated with modulator 52 using an in-phase/quadrature (IQ) modulation scheme suitable for the given application. The IQ modulation may include FSK, MSK, GMSK, PSK, BPSK, QPSK, O-QPSK, or any other suitable digital modulation scheme. Once digitally modulated, the sampling rate of the signal is then increased via upsampler 54. For example, the modulated data signal is can be at about 400 KHz such that upsampling would increase the data to a higher frequency (e.g., 26 MHz) for further processing.

Once upsampled, the data signal is then passed through a reconstruction filter 56 so as to bring the data to the correct values relative to the lower frequency data values. The reconstructed signal is then converted to an analog signal and mixed to upconvert the analog signal to the transmit frequency with low noise D/A converter and mixer block 102. As will be described in detail later, low noise D/A converter and mixer block 102 includes a hybrid digital to analog converter (HDAC) 104 and an integrated mixer 106. In accordance with the present invention however, each circuit element 54 and 56 is now driven by a clock signal, clk, that is passed through a clock converter circuit 108. The combination of the clock converter circuit 108 providing a high frequency clock hf_clk to upsampler 54 that receives the data signal at the clk frequency effectively forms an oversampling stage. While the lower frequency digital modulator 52 is clocked via a divider 60 where the clock is divided by N, the upsampler 54, the reconstruction filter 56, and the D/A converter and mixer block 102 are driven by a different clock having a frequency higher than clk.

The clock converter circuit 108 of the present embodiment is formed by a phase locked loop (PLL) 110 and a ring oscillator 112 configured in a feedback loop to increase the clock signal, clk. Thus, a high frequency clock signal is produced by the PLL 110 and ring oscillator 112 operatively arranged to transform the input clock signal, clk, having a low frequency (e.g., 26 MHz) into a high frequency clock. This allows for higher sampling rates than in the prior art transmit core of FIG. 2. The high frequency clock will be some multiple of the original clock signal (e.g., 1 GHz given an initial clock provided at, for example, 26 MHz). An advantage of the PLL 110 and ring oscillator 112 is that they are relatively small circuits which occupy insignificant chip area.

Figure 4:
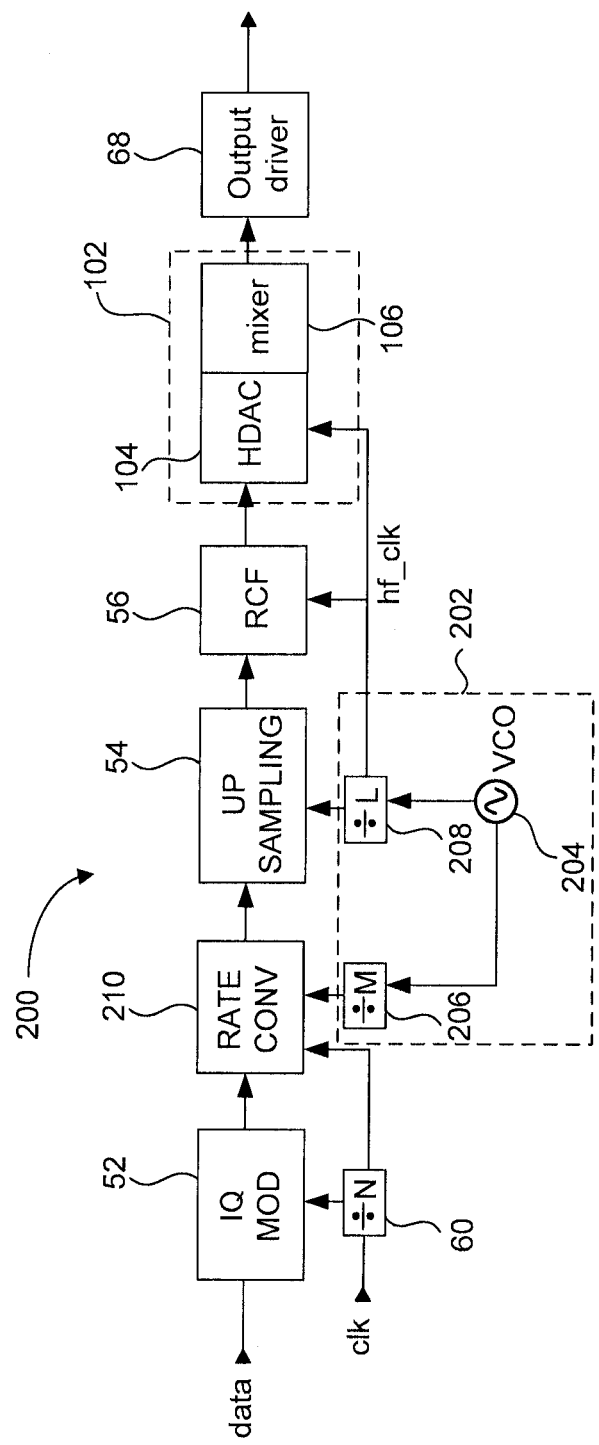
FIG. 4 is a schematic representation of an alternative embodiment of a transmitter core in accordance with the present invention.

The clock converter circuit may alternatively be formed as shown in the alternate transmit core 200 of FIG. 4. In FIG. 4, the clock converter circuit 202 includes a local oscillator, or voltage controlled oscillator 204, a divide by M circuit 206 and a divide by L circuit 208. In this embodiment, the voltage controlled oscillator (VCO) 204 is used to generate a clock signal hf_clk at a given high frequency to provide a suitable level of oversampling. In practice, the transmit VCO already on the chip can be used as VCO 204. However, the transmit VCO provides a frequency that will differ from the clock frequency clk. In such instance, a rate converter 210 is inserted between the modulator 52 and the upsampler 54. The rate converter 210 receives the clock clk divided by N and the VCO clock output divided by M, where M is a non-zero integer value. Rate converters are known in the art, and are used to convert the signal from one clock domain, ie the clk domain to the VCO domain, to a different clock domain. The upsampler 54 and the remaining downstream components receive the VCO output divided by L, where L is another non-zero integer greater than M. The rate converter 210 with signal dividers 206 and 208 and VCO 204 are combined as shown to effectively provide a different implementation of a comparable oversampling stage as seen in FIG. 3. Although the rate converter 210 may add noise to the signal, the level of the noise is not significant when operating frequencies in the range of 2 GHz are utilized.

Within either of the embodiments of FIG. 3 or FIG. 4, the increased clock frequency generated by the oversampling stage also drives a hybrid digital to analog converter (HDAC) 104 of low noise D/A converter and mixer block 102. Although the IQ modulator 52, upsampler 54, and reconstruction filter 56 are the same as in prior art FIG. 2, the HDAC 104 and the integrated mixer 106 as illustrated in FIGS. 3 and 4 are integrated in a physically connected manner at the circuit level. This integration is further illustrated with reference to low noise D/A converter and mixer block 102 as further detailed in regard to FIG. 4. The output of the low noise D/A converter and mixer block 102 is an analog signal that includes less noise than the analog signal produced by DAC 58 in prior art FIG. 2. Accordingly, the need for further analog filtering is obviated. This analog signal is then passed through an output driver 68 as is.

Figure 5:
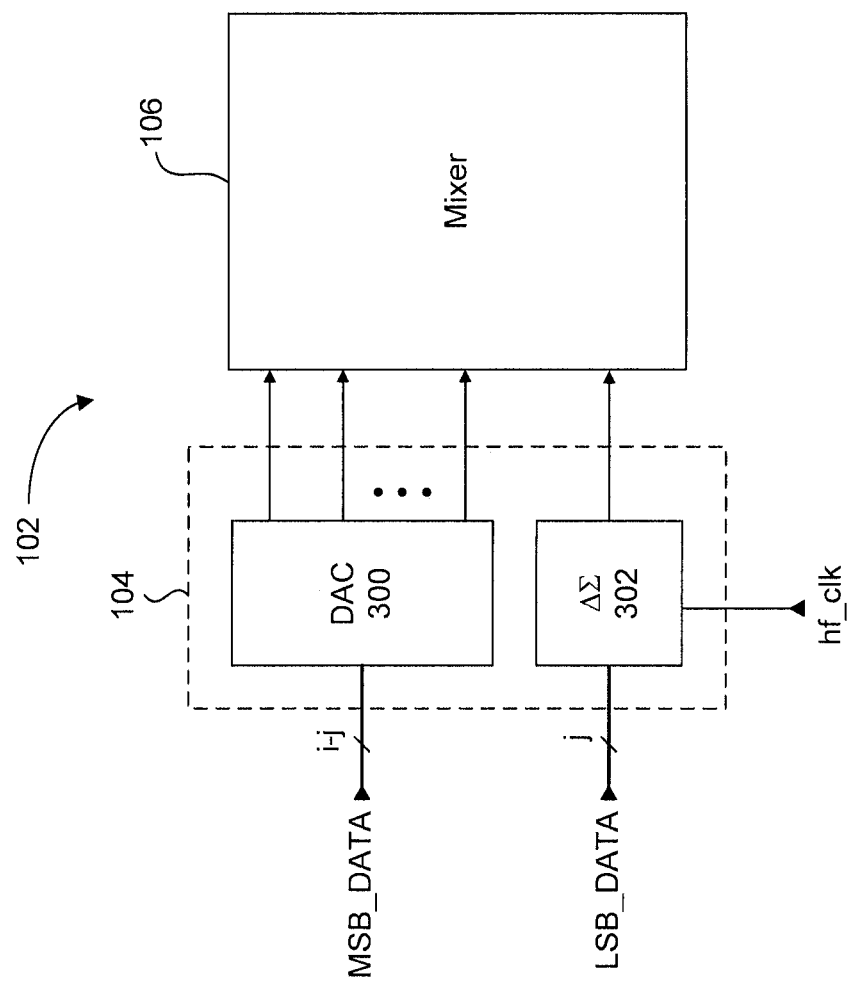
FIG. 5 is a block diagram of the D/A converter and mixer block as shown in FIG. 3 and FIG. 4.

With further reference to FIG. 5, further details of the low noise D/A converter and mixer block 102 of FIG. 3 and FIG. 4 are shown. Generally, HDAC 104 splits the data signal into a most significant bit (MSB) portion and a least significant bit portion, where both portions are processed independently of each other. The increased clock frequency generated by the oversampling stage is utilized by the HDAC 104 such that the block 102 operates with high linearly with the extracted data. In accordance with the present invention, the HDAC 104 of FIG. 4 includes two different types of digital to analog conversion circuits. First is a weighted transistor DAC 300, and second is a ΔΣ DAC 302. The weighted transistor DAC 300 converts the most significant bits of the data, called MSB_DATA, into individual currents corresponding to each bit. The ΔΣ DAC 302 converts the least significant bits of the data, called LSB_DATA, into a single current. These currents will be added together within integrated mixer 106 to form the corresponding analog signal, which is then upconverted by the mixing circuit of integrated mixer 106. If the data signal is i bits, and the LSB_DATA is j bits, then MSB_DATA is i-j bits.

Figure 6:
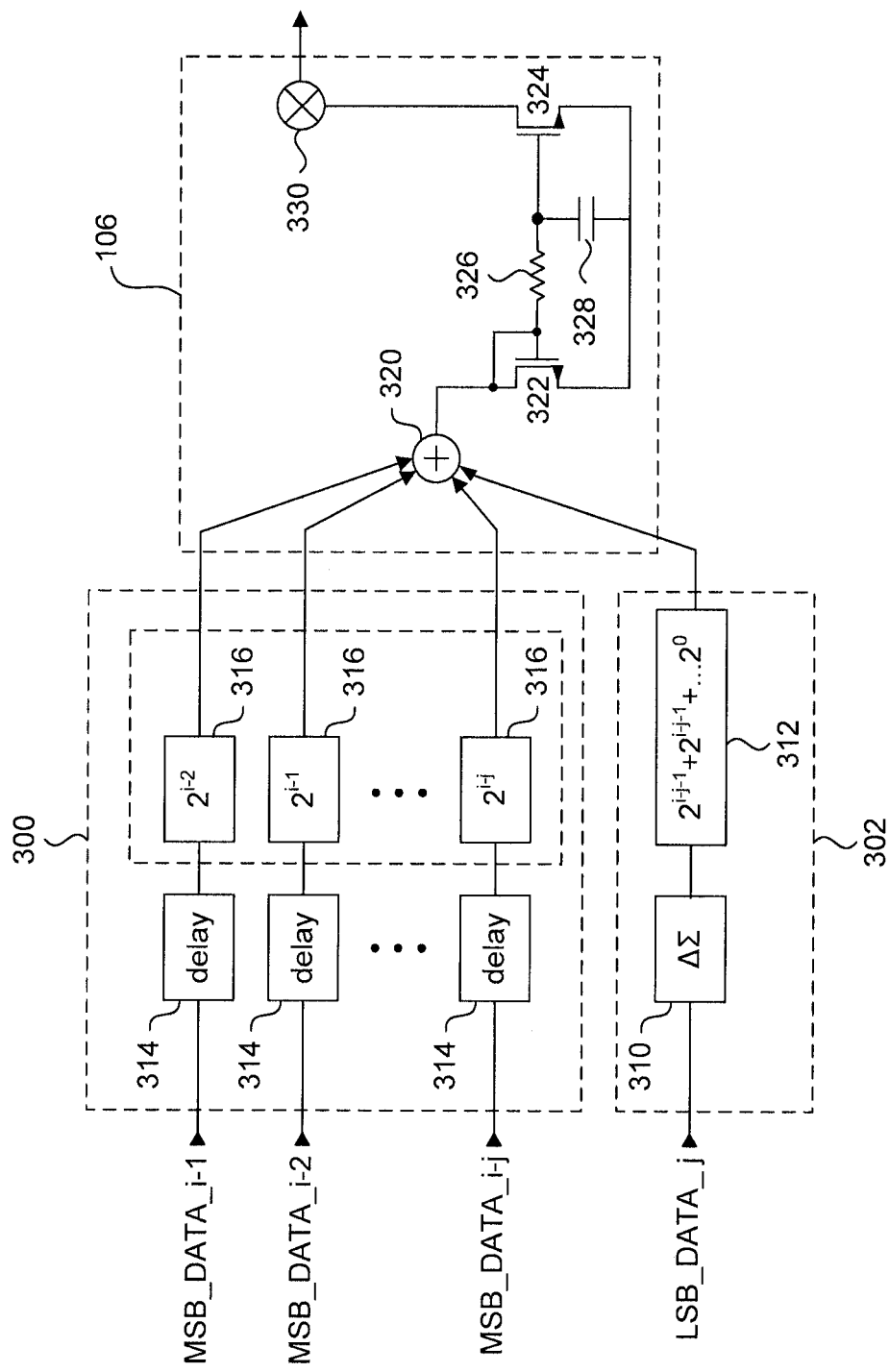
FIG. 6 is a schematic showing further details of one the D/A converter and mixer block shown in FIG. 5.

FIG. 6 is a block diagram illustrating further details of the low noise D/A converter and mixer block 102 shown in FIG. 5, according to an embodiment of the present invention. The ΔΣ DAC 302 includes a delta sigma modulator 310 for providing an analog signal corresponding to LSB_DATA_j, which are the lowest significant j bits of the data signal, and a weighted transistor element 312 that provides a single current corresponding to the j bits of LSB_DATA_j. The delta sigma modulator 310 and weighted transistor element 312 as shown will be implemented using commonly understood ΔΣ modulation techniques implemented and low-cost complementary metal-oxide-semiconductor (CMOS) processes. In general, ΔΣ modulation and CMOS implementation are details that are well known to those of ordinary skill in the semiconductor art.

The weighted transistor DAC 300 includes several pairings of a signal delay element 314 and a weighted transistor element 316. Each weighted transistor element 316 can be sized differently to provide a different current based on its logical position, when it is activated by its corresponding MSB_DATA signal. As shown in FIG. 6, each pairing receives one MSB_DATA signal and provides one current to integrated mixer 106. Because delta sigma modulator 310 has an inherent processing delay, signal delay elements 314 are included to substantially match the conversion of the MSB_DATA signal to the LSB_DATA signal. The determination of this delay can be obtained either through experimentation or analysis/simulation of the implemented circuit designs.

The integrated mixer 106 includes a summing element 320 for receiving and adding the currents generated by weighted transistor DAC 300 and ΔΣ DAC 302 to provide a final current. Summing element 320 can be any known circuit that can provide a single current corresponding to the aggregate currents it receives. The final current is received by a current mirror formed by transistors 322, 324 as shown, with a $1^{st}$ order filter. The $1^{st}$ order filter is formed by the RC circuit consisting of resistor 326 and capacitor 328. The filtered final analog current signal is then provided to mixer element 330. While not shown, mixer element 330 can be implemented with known passive mixer or active mixer circuits.

The presently shown embodiment of integrated mixer 106 in FIG. 6 includes circuit elements 320, 322, 324, 326, 328 and 330. However, it should be noted that any portion of integrated mixer 106 can be included as part of HDAC 104 shown in FIG. 5. Therefore, by using a delta sigma digital to analog converter for only the least significant bits of the data signal, any noise introduced by the delta sigma digital to analog converter will have less impact on the system since the current contribution provided therefrom is relatively small. The selection of the number of least significant bits will depend on the total desired resolution and the acceptable amount of noise being introduced by the circuits.

In terms of the instantiation of the embodiments shown in the figures, it is understood that quantization noise versus the upsampling bits (i.e., the signal to noise ratio (SNR)) is non-linear and signal-dependent. Here, SNR can be calculated by Equation 1 where N is the number of bits, $f_s$ is the sampling frequency, and BW is the signal bandwidth.

$$SNR = 6*N + 10\log(f_s/(2*BW)) \qquad \text{Equation 1}$$

For the GSM standard, the following specifications have been established. With noise filtering at 20 MHz for a 100 KHz bandwidth, the noise should be less than −85 dBm-10 log(100 k)=−135 dBm/Hz. For 30 dBm output, phase noise should be less than −165 dBc/Hz. The SNR at 20 MHz should be less than 30−(−85)=115 dB. Allowing for 10 dB of margin, the SNR should be no less than 125 dB for 20 MHz noise in the GSM licensed band (LB). Table 1 below summarizes the filtering requirements for signals of different bit size in combination with sampling frequency, in order to meet the 125 dB target.

TABLE 1

| Signal size | Sampling Frequency | SNR | Filtering requirement |
|---|---|---|---|
| 8-bit | 26 MHz | =48 + 1.7 + 21 = 70 dB | 55 dB |
| 8-bit | 1 GHz | =48 + 1.7 + 137 = 87 dB | 38 dB |
| 10-bit | 1 GHz | =60 + 1.7 + 137 = 98 dB | 27 dB |
| 11-bit | 1 GHz | =66 + 1.7 + 137 = 105 dB | 20 dB |

For an 8-bit signal with a sampling frequency of 26 MHz, the SNR is about 70 dB. Therefore, the 8-bit signal requires 55 dB of filtering at 20 Mhz, which is provided by $3^{rd}$ order filtering. For an 8-bit signal with 1 GHz upsampling, the SNR is about 87 dB and thus requires 38 dB of filtering at 20 MHz. This type of filtering is provided by $2^{nd}$ order filtering. For a 10-bit signal with sampling frequency of 1 GHz, the SNR is about 98 dB and thus requires 27 dB of filtering at 20 MHz, which is also provided by $2^{nd}$ order filtering. For an 11-bit signal with a sampling frequency of 1 GHz, the SNR is about 105 dB and thus requires 20 dB of filtering at 20 MHz. This can be provided by $1^{st}$ order filtering. As is apparent from Table 1, a combination of oversampling at a high frequency and a signal represented by a higher number of bits can result in lower noise in the converted, thereby relaxing filtering requirements. This result in significant savings in circuit area since a first order filter is much smaller than a third order filter.

With further regard to the specific example embodiment of FIG. 6, an example using an i=12-bit signal is discussed. For a 12 bit HDAC 104 will be configured to have an 8-bit weighted elements DAC 300 and a 4-bit ΔΣ DAC 302. Therefore, j=4 and the ΔΣ modulation (DSM) noise of the $1^{st}$ order ΔΣ at $f_s/2$ over a bandwidth of Δf is given by Equation 2.

$$DSM_{fs/2} = \frac{\left(\sum_{j=1}^{N-M} 2^{N-M-j}\right)^2 LSB^2}{12} \frac{4\Delta f}{f_s} \qquad \text{Equation 2}$$

Further, SNR of noise at $f_s/2$ due to ΔΣ modulation is given by equation 3.

$$SNR_{fs/2} \cong \frac{1}{2\left(\sum_{j=1}^{N-M} 2^{-(M+j)}\right)^2} \times \left(\frac{F_S}{2\Delta f}\right) \times H_{LPF}(f) \qquad \text{Equation 3}$$

Applying Equation 2 and Equation 3 for i=12 and j=4, the SNR is 124 dB at $f_s/2$. In the case of the 3rd Generation Partnership Project (3GPP), the requirement of 92 db is the worst case frequency in the standard, which the embodiments of the present invention therefore meets and exceeds.

The transmitter core architecture as shown and described herein thus represents an architecture that maximizes the amount of digital circuitry. Those of skill in the art will understand that such a transmitter path configuration would be simpler to implement as there are less analog components than the prior art described herein. The present invention therefore obtains higher bit rates using ΔΣ modulation in the DAC advantageously using only current summing. This obviates the need for any V2I element and substantially reduces filtering requirements.

This listing of components in the aforementioned inventive transmitter core is not comprehensive, and any person of skill in the art will understand that the specific configuration will depend on the communication standard being adhered to and the chosen transmitter architecture. Moreover, the above-described embodiments of the present invention are intended to be examples only. Alterations, modifications and variations may be effected to the particular embodiments by those of skill in the art without departing from the scope of the invention, which is defined solely by the claims appended hereto.

What is claimed is:

1. A wireless device transmitter for transmitting a radio frequency (RF) output signal, said transmitter comprising:
    an input stage for receiving a modulated digital signal;
    an oversampling stage for increasing a frequency of said modulated digital signal to form an oversampled signal of i bits in size, where i is an integer value greater than 1; and
    a digital to analog converter (DAC) circuit for receiving said i bits of the oversampled signal, said DAC circuit including:
        a delta sigma (ΔΣ) converter for generating a first analog signal, which is a first current, corresponding to j least significant bits of the oversampled signal;
        a weighted transistor digital to analog converter for receiving i-j most significant bits of the oversampled signal and for generating i-j corresponding analog signals, which are i-j corresponding currents, where j is an integer value greater than 1 and less than i;
        a current summing element for generating a final current corresponding to the aggregate sum of the first current and the i-j corresponding current; and
        a current mirror circuit having a first order filtering circuit for receiving the final current to provide a filtered final current signal.

2. The wireless device transmitter of claim 1, where said oversampling stage includes a clock converter circuit that produces a high frequency clock for driving at least an upsampling circuit, a reconstruction filter circuit, and said DAC circuit.

3. The wireless device transmitter of claim 2, where said clock converter circuit producing said high frequency clock includes a phase locked loop and ring oscillator operatively arranged to transform an input clock signal having a low frequency into said high frequency clock.

4. The wireless device transmitter of claim 2, where said oversampling stage includes an analog component formed by a voltage controlled oscillator (VCO) and said clock converter circuit is formed by at least two clock dividers and a rate conversion circuit where said VCO and said clock converter circuit are operatively arranged such that an output of said VCO forms said high frequency clock.

5. The wireless device transmitter of claim 1, wherein said input stage and said oversampling stage operate in a digital domain.

6. The wireless device transmitter of claim 1, wherein said DAC circuit includes a mixer circuit for upconverting the filtered final current signal.

7. A method for processing a radio frequency (RF) output signal in a wireless device transmitter, said method comprising:
    receiving a modulated digital signal;
    employing an oversampling stage to obtain an oversampled signal of said modulated digital signal, wherein said oversampled signal is i bits in size and said i is an integer value greater than 1;
    converting j bits of the oversampled signal into a first analog signal, which is a first current, using a delta sigma (ΔΣ) converter, where j is an integer value greater than 1 and less than i;
    converting i-j bits of the oversampled signal into i-j corresponding analog signals, which are i-j corresponding currents, using a weighted transistor digital to analog converter;
    using a current summing element to generate a final current corresponding to the aggregate sum of the first current and the i-j corresponding currents; and
    using a current mirror having a first order filtering circuit to receive the final current to provide a filtered final current signal.

8. The method as claimed in claim 7, wherein said oversampling is accomplished by generating an increase to said clock frequency using a phase locked loop and ring oscillator operatively arranged to transform an input clock signal having a low frequency into a high frequency clock.

9. The method as claimed in claim 7, wherein said oversampling is accomplished by generating an increase to said clock frequency using an analog component formed by a voltage controlled oscillator (VCO) and a clock converter circuit formed by at least two clock dividers and a rate conversion circuit where said VCO and said clock converter circuit are operatively arranged such that an output of said VCO forms a high frequency clock.

* * * * *